US00RE47601E

(19) United States
(12) Reissued Patent
Schafferer et al.

(10) Patent Number: US RE47,601 E
(45) Date of Reissued Patent: Sep. 10, 2019

(54) HIGH OUTPUT POWER DIGITAL-TO-ANALOG CONVERTER SYSTEM

(71) Applicant: ANALOG DEVICES, INC., Norwood, MA (US)

(72) Inventors: Bernd Schafferer, Amesbury, MA (US); Bing Zhao, Andover, MA (US)

(73) Assignee: ANALOG DEVICES, INC., Norwood, MA (US)

(21) Appl. No.: 15/080,160

(22) Filed: Mar. 24, 2016

Related U.S. Patent Documents

Reissue of:
(64) Patent No.: 8,970,418
Issued: Mar. 3, 2015
Appl. No.: 14/222,223
Filed: Mar. 21, 2014

U.S. Applications:
(60) Provisional application No. 61/867,233, filed on Aug. 19, 2013.

(51) Int. Cl.
*H03M 1/66* (2006.01)
*H03M 1/74* (2006.01)

(52) U.S. Cl.
CPC ..... *H03M 1/74* (2013.01); *H03M 1/747* (2013.01)

(58) Field of Classification Search
CPC ..... H03M 1/74; H03M 1/747
See application file for complete search history.

(56) References Cited

U.S. PATENT DOCUMENTS 4,870,416 A * 9/1989 Mapleston ..... 341/110
4,894,657 A * 1/1990 Hwang et al. ..... 341/158
(Continued)

FOREIGN PATENT DOCUMENTS

CN 101635571 1/2010
CN 102291148 2/2011
(Continued)

OTHER PUBLICATIONS

Office Action (OA1) issued in CN Patent Application Serial No. 201410098234.4 dated Aug. 15, 2016, 12 pages [EN Summary of Relevance included].

(Continued)

*Primary Examiner* — Eric B. Kiss
(74) *Attorney, Agent, or Firm* — Patent Capital Group

(57) ABSTRACT

The present disclosure discloses a digital-to-analog converter (DAC) design which is suitable for providing a high output power high-speed DAC, e.g., in radio frequency applications. The DAC design utilizes a parallel DAC structure, e.g., having 8 parallel DACs and an aggregate current output, to provide a high and programmable current output (in some implementations, up to 512 mA or more). The parallel DAC structure alleviates the design problems which exist in trying to output a high amount of current using a single DAC. The DAC design further utilizes a hybrid structure which integrates the signal chain for a more reliable system. In some embodiments, the hybrid structure uses a CMOS process for the current sources and switches and a GaAs cascode stage for combining the outputs to optimally leverage the advantages of both technologies. The result is a highly efficient DAC (with peak output power programmable up to 29 dBm or more).

24 Claims, 6 Drawing Sheets

(56) References Cited

U.S. PATENT DOCUMENTS

| | | | | |
|---|---|---|---|---|
| 5,023,566 | A | 6/1991 | El-Hamamsy et al. | |
| 5,285,505 | A | 2/1994 | Kim et al. | |
| 5,490,223 | A | 2/1996 | Nishimura et al. | |
| 5,647,023 | A | 7/1997 | Agazzi et al. | |
| 5,689,258 | A | 11/1997 | Yasuyuki et al. | |
| 5,953,648 | A | 9/1999 | Hutchinson et al. | |
| 6,035,320 | A | 3/2000 | Kiriaki et al. | |
| 6,150,970 | A * | 11/2000 | Anagnos | 341/144 |
| 6,304,140 | B1 | 10/2001 | Thron et al. | |
| 6,304,517 | B1 | 10/2001 | Ledfelt et al. | |
| 6,339,399 | B1 | 1/2002 | Andersson et al. | |
| 6,593,869 | B1 | 7/2003 | Elliott | |
| 6,614,288 | B1 | 9/2003 | Dagan et al. | |
| 6,771,711 | B2 * | 8/2004 | Kranz et al. | 375/305 |
| 6,774,683 | B2 | 8/2004 | Schafferer | |
| 6,798,251 | B1 | 9/2004 | Schafferer | |
| 6,973,138 | B1 | 12/2005 | Wright | |
| 6,981,185 | B1 | 12/2005 | Davis et al. | |
| 7,042,379 | B2 | 5/2006 | Choe | |
| 7,068,201 | B1 | 6/2006 | Chou | |
| 7,138,790 | B2 | 11/2006 | Hackner et al. | |
| 7,312,740 | B2 | 12/2007 | Chou | |
| 7,466,252 | B1 * | 12/2008 | Radulov et al. | 341/120 |
| 7,504,976 | B1 | 3/2009 | Pellon | |
| 7,545,194 | B2 | 6/2009 | Chen et al. | |
| 7,570,188 | B2 | 8/2009 | Marais | |
| 7,679,538 | B2 | 3/2010 | Tsang | |
| 7,701,373 | B2 | 4/2010 | Tokumaru et al. | |
| 7,801,870 | B2 | 9/2010 | Oh et al. | |
| 7,835,699 | B2 | 11/2010 | Park | |
| 7,847,717 | B2 | 12/2010 | Mishra et al. | |
| 7,898,446 | B2 | 3/2011 | Nagarajan et al. | |
| 7,903,016 | B1 | 3/2011 | Wyatt | |
| 7,924,196 | B2 * | 4/2011 | Gustat | 341/144 |
| 7,965,211 | B1 | 6/2011 | Landt et al. | |
| 7,978,572 | B2 | 7/2011 | Nagai | |
| 8,009,095 | B2 | 8/2011 | Schlee et al. | |
| 8,031,098 | B1 | 10/2011 | Christian et al. | |
| 8,154,432 | B2 | 4/2012 | Kaper et al. | |
| 8,194,811 | B2 | 6/2012 | Song et al. | |
| 8,284,860 | B2 | 10/2012 | Xu et al. | |
| 8,351,877 | B2 | 1/2013 | Kim et al. | |
| 8,417,200 | B1 | 4/2013 | Gomez et al. | |
| 8,548,403 | B2 | 10/2013 | Kim et al. | |
| 8,618,969 | B2 | 12/2013 | Wyville | |
| 8,703,623 | B2 | 4/2014 | Chung et al. | |
| 8,860,593 | B2 * | 10/2014 | Kimura et al. | 341/120 |
| 8,885,763 | B2 | 11/2014 | Ananthaswamy | |
| 8,890,618 | B2 | 11/2014 | Pamarti et al. | |
| 8,948,301 | B2 | 2/2015 | Rollins | |
| 8,970,418 | B1 | 3/2015 | Schafferer et al. | |
| 9,276,617 | B2 | 3/2016 | Schafferer et al. | |
| 9,281,788 | B2 | 3/2016 | Schafferer et al. | |
| 2001/0052868 | A1 | 12/2001 | Masuda | |
| 2002/0030619 | A1 * | 3/2002 | Abel | H03K 17/04106 341/144 |
| 2002/0048326 | A1 | 4/2002 | Sahlman | |
| 2003/0179831 | A1 | 9/2003 | Gupta et al. | |
| 2004/0104832 | A1 | 6/2004 | Bugeja | |
| 2006/0284746 | A1 | 12/2006 | Huang | |
| 2007/0026823 | A1 | 2/2007 | Eisenhut et al. | |
| 2007/0241812 | A1 | 10/2007 | Yang et al. | |
| 2007/0275676 | A1 | 11/2007 | Reza et al. | |
| 2008/0024182 | A1 | 1/2008 | Choi | |
| 2009/0326692 | A1 | 12/2009 | Lin et al. | |
| 2010/0225372 | A1 | 9/2010 | Satoh | |
| 2010/0328124 | A1 | 12/2010 | O'Donnell et al. | |
| 2011/0227770 | A1 | 9/2011 | Kaper et al. | |
| 2011/0285441 | A1 | 11/2011 | Suzuki | |
| 2011/0299207 | A1 | 12/2011 | McMahill et al. | |
| 2012/0154038 | A1 | 6/2012 | Kim et al. | |
| 2013/0163694 | A1 | 6/2013 | Bai et al. | |
| 2013/0207823 | A1 | 8/2013 | Wyville | |
| 2013/0285998 | A1 | 10/2013 | Hong et al. | |
| 2014/0184323 | A1 | 7/2014 | Wilson | |
| 2014/0203871 | A1 | 7/2014 | Pamarti et al. | |
| 2014/0269979 | A1 * | 9/2014 | Schafferer et al. | 375/295 |
| 2014/0269988 | A1 | 9/2014 | Schaffer et al. | |
| 2014/0313065 | A1 | 10/2014 | Schafferer | |
| 2014/0362949 | A1 | 12/2014 | Pratt | |
| 2015/0048961 | A1 | 2/2015 | Schafferer et al. | |
| 2015/0124907 | A1 | 5/2015 | Li et al. | |
| 2015/0171878 | A1 | 6/2015 | Schafferer et al. | |

FOREIGN PATENT DOCUMENTS

| | | |
|---|---|---|
| CN | 102347750 | 2/2012 |
| CN | 102361444 | 2/2012 |
| EP | 391044 | 10/1990 |
| EP | 1478084 B1 | 11/2004 |
| EP | 2184859 | 5/2010 |
| EP | 2251976 | 11/2010 |
| EP | 2530832 | 12/2012 |
| EP | 2779442 | 9/2014 |
| EP | 2779443 | 9/2014 |
| EP | 2840714 | 2/2015 |
| WO | 2001/10013 | 2/2001 |
| WO | 2013/019819 | 2/2013 |

OTHER PUBLICATIONS

Office Action (OA1) issued in CN Patent Application Serial No. 201410099136.2 dated Nov. 1, 2016, 6 pages [EN Summary of Relevance included].

1st Action Notice of Allowance in U.S. Appl. No. 14/222,223 dated Oct. 28, 2014, 10 pages.

Extended European Search Report issued in EP Patent Application Serial No. 14179863.7 dated Feb. 27, 2015, 10 pages.

Advisory Action issued in U.S. Appl. No. 14/628,730 dated Dec. 7, 2016, 3 pages.

Office Action (OA1) issued in CN Patent Application Serial No. 201410401228.1 dated Mar. 6, 2017, 10 pages.

2nd Notice of Allowance in U.S. Appl. No. 14/210,304 dated May 27, 2015, 10 pages.

AD9734/AD9735/AD9736—Analog Devices Data Sheet—10-/12-/14-Bit, 1200 MSPS DACS, Rev. A, © 2006 Analog Devices, Inc., 72 pages.

Adams, R. "A 3V CMOS 400mW 14b 1.4GS/s DAC for Multi-Carrier Applications", Solid-State Circuits Conference, 2004, Digest of Technical Papers, ISSCC, 2004 IEEE International, Feb. 15-19, 2004, vol. 1, 10 pages.

Ajay Kuckreja, "Digital RF Modulators for CCAP," Aug. 20, 2012, www.cedmagazine.com/articles/2012/08/digital-rf-modulators-for-ccap, May 7, 2015, 5 pages.

Blog, D1 I/V with 4x TDA1543, http://www.diyaudio.com/forums/pass-labs/196937-d1-i-v-4x-tda1543.html, Pass Labs, Sep. 20, 2011, 4 pages.

Blog, The Pass D1 for TDA1543, http://www.diyaudio.com/forums/digital-line-level/32999-pass-d1-tda15 . . . , Digital Line Level, DACs, Digital Crossovers, Equalizers, etc., Apr. 26, 2004, 6 pages.

DARPA, Broad Agency Announcement, Direct Digital to High Power Analog Conversion Technology (PowerDAC), DARPA Microsystems Technology Office (MTO), DARPA-BAA-11-12, Jan. 13, 2011, 46 pages.

Dong-U Lee et al., "Hierarchical Segmentation for Hardware Function Evaluation," IEEE Transactions on Very Large Scale Integration (VLSI) Systems, vol. 17, No. 1, Jan. 2009, 1063-8210/$25.00 © 2008 IEEE, pp. 103-116 (14 pages).

European Search Report for European Patent Application Serial No. 1459434.1 dated Jun. 6, 2014, 7 pages.

Extended European Search Report for European Application Serial No. 14158853.3 dated Oct. 21, 2014, 10 pages.

Final Office Action in U.S. Appl. No. 14/201,845 dated Jun. 30, 2015, 17 pages.

Final Office Action issued in U.S. Appl. No. 14/206,451 dated Jul. 7, 2015, 19 pages.

Final Office Action issued in U.S. Appl. No. 14/628,730 dated Oct. 15, 2015, 20 pages.

(56) References Cited

OTHER PUBLICATIONS

Kelly Mekechuk et al., "Linearizing Power Amplifiers Using Digital Predistortion, EDS Tools and Test Hardware", High Frequency Design, Amplifier Linearization, From Apr. 2004 High Frequency Electronics © 2004 Summit Technical Media, LLC, 7 pages.
MAX5113 9-Channel, 14-Bit Current DAC with SPI Interface", May 31, 2013, XP055171135, http://datasheets.maximintegrated.com/en/ds/MAX5113.pdf, xx pages.
Mohammad S. Mehrjoo et al., "A 10-b, 300-MS/s Power DAC with 6-V pp Differential Swing", Department of Electrical and Computer Engineering, University of California, San Diego, La Jolla, CA, RMO3A-4, 978-1-4673-6062-3/13 © 2013 IEEE, 2013 IEEE Radio Frequency Integrated Circuits Symposium, pp. 163-166.
Non-Final Office Action in U.S. Appl. No. 14/210,304 dated Oct. 3, 2014, 9 pages.
Non-Final Office Action in U.S. Appl. No. 14/201,845 dated Dec. 19, 2014, 16 pages.
Non-Final Office Action issued in U.S. Appl. No. 14/628,730 dated Apr. 27, 2015, 21 pages.
Non-Final Office Action issued in U.S. Appl. No. 14/628,730 dated Feb. 19, 2016, 20 pages.
Notice of Allowance in U.S. Appl. No. 14/201,845 dated Nov. 9, 2015, 6 pages.
Notice of Allowance in U.S. Appl. No. 14/206,451 dated Oct. 29, 2015, 9 pages.
Notice of Allowance in U.S. Appl. No. 14/210,304 dated Feb. 3, 2015, 10 pages.
Office Action in European Patent Application Serial No. EP14159343.1 dated May 21, 2015, 5 pages.
Patent Abstracts of Japan, vol. 14, No. 494, Japan (P-1123), Oct. 26, 1990 & JP-A-02202689 (Fujitsu Ltd) Aug. 10, 1990, abstract, 1 pages.
Patent Abstracts of Japan, vol. 15. No. 368 (P1235). Japan Sep. 17, 1991 & .TP-A-03 144788 (Nee Corp) Jun. 20, 1991, abstract, 1 page.
Radulov et al., "Flexible and Self-Calibrating Current-Steering Digital-to-Analog Converters: Analysis, Classification and Design", ISBN: 978-90-386-2125-8, 290 pages.
Response to European Search Report in EP Patent Application Serial No. 14159962.1 filed Mar. 4, 2015, 11 pages.
Response to Extended European Patent Search Report for EP Application No. 14158853.3 filed Mar. 20, 2015, 17 pages.
Response to Extended European Search Report for EP14159434.0 filed Jan. 23, 2015, 15 pages.
Response to Extended European Search Report for EP14179863.7 filed Sep. 30, 2015, 23 pages.
Response to May 21, 2015 Office Action issued in EP 14159434.1 filed Sep. 21, 2015, 12 pages.
Tsutomu Sasao et al., "Numerical Function Generators Using LUT Cascades," IEEE Transactions on Computers, vol. 56, No. 6, Jun. 2007, 0018-9340/07/$25.00 © 2007 IEEE, Published by the IEEE Computer Society, pp. 826-838 (14 pages).
WMS: High-Power Efficient RF Digital-to-Analog Converter (HiPERDAC), IEEE, International Microwave Symposium, Jun. 2-7, 2013, Seattle, WA MTT-S, RFIC2013, Seattle, 36 pages.
Radulov et al., "Calibration of Current-Steering D/A Converters", Proceedings of Analog/Mixed-Signal Innovation Network "Digitally Assisted Analogue", Oct. 22, 2009, Dublin, Ireland,—S.I. : s.n., 2009.—p. 1-26 (27 pages total) © 2009, http://repository.tue.nl/666558.

* cited by examiner

HIGH OUTPUT POWER DIGITAL-TO-ANALOG CONVERTER SYSTEM

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

PRIORITY DATA

This is a non-provisional application of U.S. Provisional Application 61/867,233 entitled "HIGH OUTPUT POWER DIGITAL-TO-ANALOG CONVERTER SYSTEM" and filed Aug. 19, 2013. This referenced provisional application is hereby incorporated by reference.

TECHNICAL FIELD OF THE DISCLOSURE

The present disclosure relates generally to providing a digital-to-analog converter and, more particularly, to providing a high output power digital-to-analog converter comprising a plurality of digital-to-analog converters in parallel.

BACKGROUND

Digital to Analog converters are ubiquitous in electronics where a digital signal is converted into an analog signal, e.g., for output or transmission. Digital to analog converters are used in many applications including audio output systems and radio frequency transmitters. There is a myriad of designs for DACs, and the designs may vary depending on the application and performance requirements.

OVERVIEW

The present disclosure discloses a digital-to-analog converter (DAC) design which is suitable for providing a high output power high-speed DAC, e.g., in radio frequency applications. The DAC design utilizes a parallel DAC structure, e.g., having 8 parallel DACs and an aggregate current output, to provide a high and programmable current output (in some implementations, up to 512 mA or more). The parallel DAC structure alleviates the design problems which exist in trying to output a high amount of current using a single DAC. The DAC design further utilizes a hybrid structure which integrates the signal chain for a more reliable system. In some embodiments, the hybrid structure uses a CMOS process for the current sources and switches and a GaAs cascode stage for combining the outputs to optimally leverage the advantages of both technologies. The result is a highly efficient DAC (with peak output power programmable up to 29 dBm or more).

DESCRIPTION OF EXAMPLE EMBODIMENTS OF THE DISCLOSURE

Figure 1:
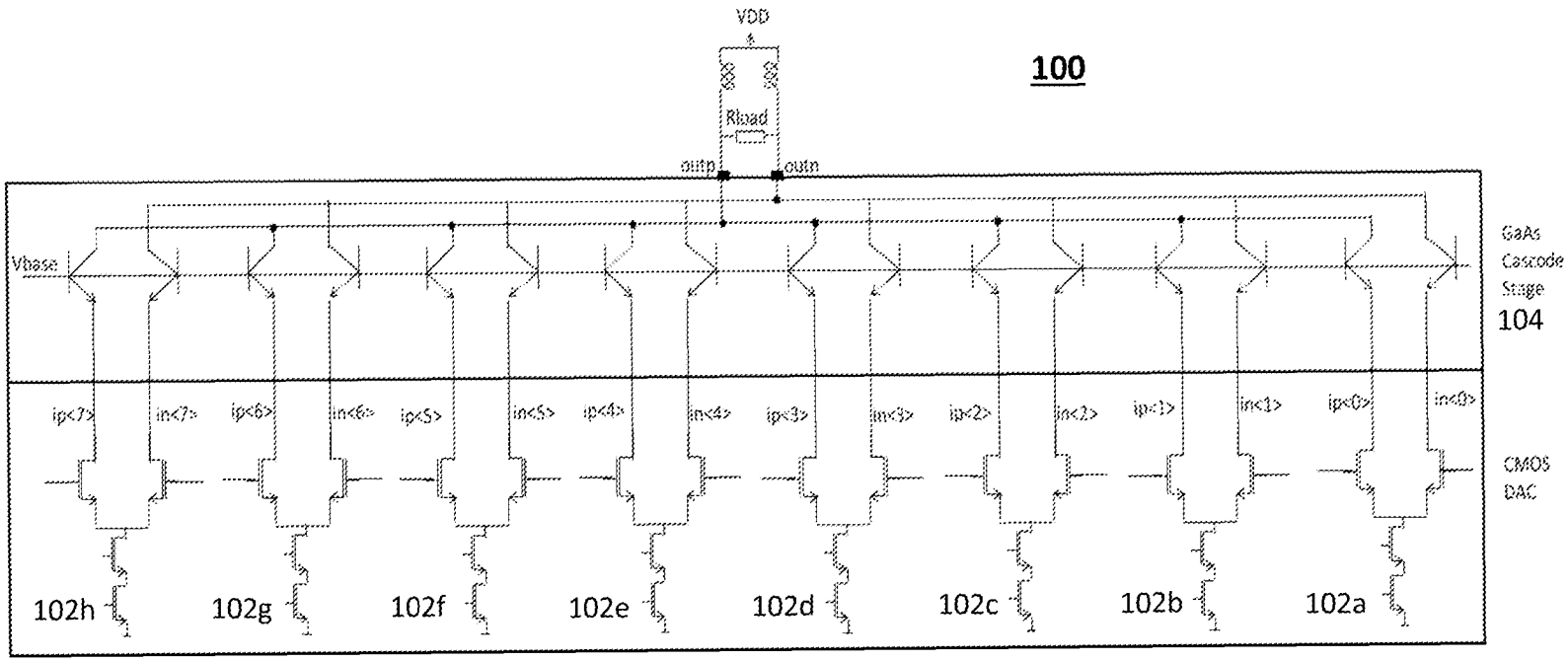
FIG. 1 is a simplified circuit diagram illustrating a digital-to-analog converter, according to some embodiments of the disclosure.

Transmitters are electronic circuits which transmit signals over the wire or over the air to allow remote devices to communicate with each other. Transmitters are used in many electronic equipment such as base stations, broadcasting infrastructure equipment, mobile devices, radios, and any practically any electronic device configured to transmit signals to another electronic device. Typically, a digital system generates digital information to be communicated, and a transmitter is provided between the digital system and the medium on which information is communicated. The transmitter would convert the digital information (i.e., in a digital signal) from the digital system into an analog signal suitable for transmission over the medium. For instance, a radio transmitter may convert the digital signal in baseband into an analog signal suitable for transmission in the radio frequency domain. In some instances, transmitters are combined with a receiver as part of a transceiver.

Generally, Radio Frequency (RF) transmitters can include a digital signal source for carrying data, a digital-to-analog converter (DAC) for converting the digital signal source to an analog signal, and a power amplifier for amplifying the analog signal prior to transmitting the signal over the air or the cable. As mobile devices become ubiquitous, the need to provide very efficient RF transmitters and base stations also rises. Improving efficiency of radio frequency (RF) transmitters is one of the main objectives in RF designs.

In some RF designs, the output power of the DAC is important in ensuring high efficiency in the DAC as well as in the power amplifier. Greater efficiency in the DAC and the power amplifier improves performance and lowers costs. Power is equal to the product of voltage and current, and increasing the voltage and the current of a DAC is not a trivial task. Challenges exist in the hardware in providing a high power output DAC. More challenge exists in ensuring that a DAC with high output power is reliable and is capable of producing a quality analog output (with little noise). This is especially true when the DAC is used with a digital pre-distortion (DPD) system, which normally performs better when the DAC has less random errors.

Conventional transmitter DACs used in radio frequency systems suffer from drain efficiency problems (usually less than 1%). Furthermore, some transmitter DACs usually have low output currents of 20 mA to 30 mA (and has a relatively low power). As-the transmitter systems continue to demand higher capacities and bandwidth, the need for having a power efficient high power transmitter DAC rises. For this reason, instead of relying on using a single DAC to provide a high current output (which can be unreliable), the present disclosure discloses a DAC which comprises of a plurality of parallel DAC cores. These DAC cores can, in aggregate, generate a high amount of output current and provide a myriad of design advantages.

The present disclosure relates to, in some embodiments, a DAC system comprising four, six, or eight (or even more) parallel DAC cores. According to one aspect of the disclosure, the same input word may be provided as the digital input signal to the parallel DAC cores, and the outputs from the DAC cores may be combined to provide an aggregate analog output. According to another aspect, the outputs of the DACs are amplified and combined in a cascode stage. The cascode stage may include eight (or more) parallel cascodes directly connected to the eight parallel DAC cores. The cascode stage may include a power combining network to combine the output power at the outputs of the cascodes. The present disclosure further describes design features which address issues of thermal stability and timing skews which may be present in a layout comprising parallel DACs.

The architecture provides a hybrid yet integrated structure which combines two different process technologies, one used for the parallel DAC structures to produce a high current output, and another one used for the cascode stage to produce a high voltage output. Specifically, the DAC integrates the power electronics in the converter design by combining complementary metal-oxide semiconductor (CMOS) process and high breakdown voltage compound semiconductor (e.g., Gallium Arsenide (GaAs)) on a multi-chip module (MCM).

Broadly speaking, the parallel DAC cores can be built using any one or more of the following: complementary metal-oxide-semiconductor (CMOS) technology, bipolar-complementary metal-oxide-semiconductor (BiCMOS), silicon-on-insulator (SOI), or any other suitable material. The cascode stage can be built using any one or more of the following: Gallium Arsenide (GaAs) cascodes and/or Gallium Nitride (GaN) cascodes, or cascodes made with any other suitable material.

Generating and switching current in fine line CMOS process is power efficient and fast, but the voltage swing on the transistor is limited. Another advantage of submicron CMOS process is the amount of digital signal processing which can be integrated in reasonable power/area requirements. The high break down voltage of GaAs cascode stage enables high output swings while limiting the voltage on CMOS DAC. Therefore the resulting DAC merges a current steering DAC core in CMOS with a cascode output driver stage in GaAs to optimally leverage the advantages of both technologies. Integrating the signal generation function and the power amplification function together in a DAC allows the designer to budget more power to the DAC and hence improve performance.

The result is a DAC system which has a high output power and high drain efficiency. In some applications (e.g., depending on the output power requirements), the high output power of the DAC system may eliminate the need to have a power amplifier in an RF transmitter, or alleviate the need for a power amplifier with a very high gain in the RF transmitter, thereby greatly simplifying the overall design of the RF transmitter. Furthermore, the combined system of the DAC stage and the cascode stage provides a more seamless integration of the signal chain, which adds benefits such as stability, smaller footprint, lower cost, better performance, and higher power efficiency.

Integrating the signal generation and the power section of the transmit path of an RF transmitter is an important step towards achieving the high level of integration along the signal chain. There are numerous challenges and technical difficulties involved in order to efficiently generate high output power in radio frequency (RF) DACs. Embodiments of the present disclosure aim to achieve high output power and high drain efficiency while overcoming some of these difficulties.

Parallel DACs Structure

FIG. 1 is a simplified circuit diagram illustrating a digital-to-analog converter (system), according to some embodiments of the disclosure. The DAC system 100 comprises eight parallel DAC cores 102a-h. Each DAC core may be implemented using a suitable CMOS DAC circuit, such as the one shown, configured to receive an digital signal input code, and output a pair of differential signals (e.g., ip<0>, in <0> for the right-most DAC core). While eight DAC cores are shown, it is envisioned that other numbers of DAC cores may also be used, where the DAC system (or the DAC stage of the DAC system) can include multiple DAC core structures that are replicated in the hardware layout of the DAC system. For instance, it is envisioned that 2, 4, 6, 8, 10, 12, 14, 16, 18, 20, 22, 24 (and so forth) DAC cores may be provided in the DAC system.

Advantageously, some design requirements in the DAC hardware may be relaxed (i.e., design requirements for the individual-DACs) when a high output current can be provided collectively by the eight individual parallel DAC cores, rather than by a single DAC core. Not only design requirements may be relaxed, the additive effect of the parallel DAC cores provides a high (aggregate) current output when the outputs are combined. As a result, the DAC system is able to provide high output power while maintaining efficiency and reliability at each parallel DAC core.

In one embodiment, the same input code is provided to each of the parallel DAC core, and the outputs from the parallel DAC can be combined at the output to generate a high (aggregate) current output to provide a high power output DAC. Each DAC may have a programmable current output, where each DAC core may generate more than 32 milliamps and in some cases up to 64 milliamps. It is noted that such a range of current exceeds conventional DAC cores on the market. In some cases, each DAC core may generate 40 or more milliamps and up to 64 milliamps, or 50 or more milliamps and up to 64 milliamps.

When the outputs of the eight parallel DAC cores are combined or aggregated, the DAC system may generate an analog output signal having more than 256 milliamps and up to 512 milliamps. When compared to DACs which do not use parallel DAC cores (generating roughly a maximum of 30 milliamps), or less than eight parallel DAC cores, the DAC system may advantageously generate 50 milliamps or more and up to 512 milliamps, 75 milliamps or more and up to 512 milliamps, 100 milliamps or more and up to 512 milliamps, 200 milliamps or more and up to 512 milliamps, 300 milliamps or more and up to 512 milliamps, or 400 milliamps or more and up to 512 milliamps. It is further noted that such a range of current using this DAC system of eight parallel DAC core generates a significant amount of current that the market has not seen before. While in some cases, a single DAC core may be configured to generate a high amount of current. But in such a DAC core, the static and timing matching, the thermal stability, etc., become significant design challenges. In some embodiments, a DAC system having four or more parallel DAC cores may operate optimally in generating varying output currents ranging from 100 milliamps to 3 amps, from 100 milliamps to 3 amps, from 500 milliamps to 3 amps, and so forth. It is not practical for a single DAC core to generate such a high output current level. Not only the DAC system is able to generate a high current output, the programmability of each DAC core provides a highly flexible DAC system with a high power output.

The integrated parallel DAC can address the communications infrastructure segment and the wireless infrastructure segment such as the cable modem termination system (CMTS), distributed antenna system networks, micro-cell base stations, etc. Different output power levels are desired in various applications, which can range from around 20 dBm to around 40 dBm. Therefore, the requirement of the output power, or the output current, is a critical parameter. The DAC system described in the present disclosure having the parallel DAC structure can be advantageously implemented to meet various output power requirements.

Cascode Stage

Together with the integrated parallel DAC cores, a cascode stage is provided to achieve even better performance and meet the various output power requirements demanded by a wide range of applications. In some embodiments, a cascode stage 104 is provided in the DAC system 100. A cascode stage can withstand larger voltage swing, which also enables the DAC system 100 to achieve higher power output. The cascode stage may include eight parallel cascodes, which are directly connected to the (differential) outputs of the eight parallel DAC cores. The outputs of the cascodes may be joined in a power combining network in the cascode stage to effectively combine and amplify the outputs from the eight parallel DAC cores to provide an aggregate (high current and high voltage) analog output (denoted as "outp" and "outn" in FIG. 1 illustrating an embodiment generating a differential aggregate analog output).

In some embodiments, the eight parallel DAC cores is manufactured using CMOS technology, e.g., 65 nm CMOS technology, and the cascode stage comprises GaAs based cascodes. The result is a chip produced using a hybrid process. The high break down voltage of GaAs enables high output voltage swings, which is advantageous for voltage amplification because the eight parallel DACs are limited to only 1.3 V when 65 nm CMOS technology is used for the parallel DAC cores. At the same time, CMOS technology provides very power efficient and fast current generation and switching. By providing the cascode stage, the overall DAC system 100 is able to provide high voltage and high current output and ensure the reliability of the CMOS DAC cores by limiting the voltage swing of the parallel DAC cores to a suitable level. To provide a two stage amplification process leveraging advantages of both CMOS and GaAs technologies, a multi-chip module may be used for integrating the parallel DAC cores and the cascode stage.

Interface Between DAC Cores and Cascode Stage

Figure 2:
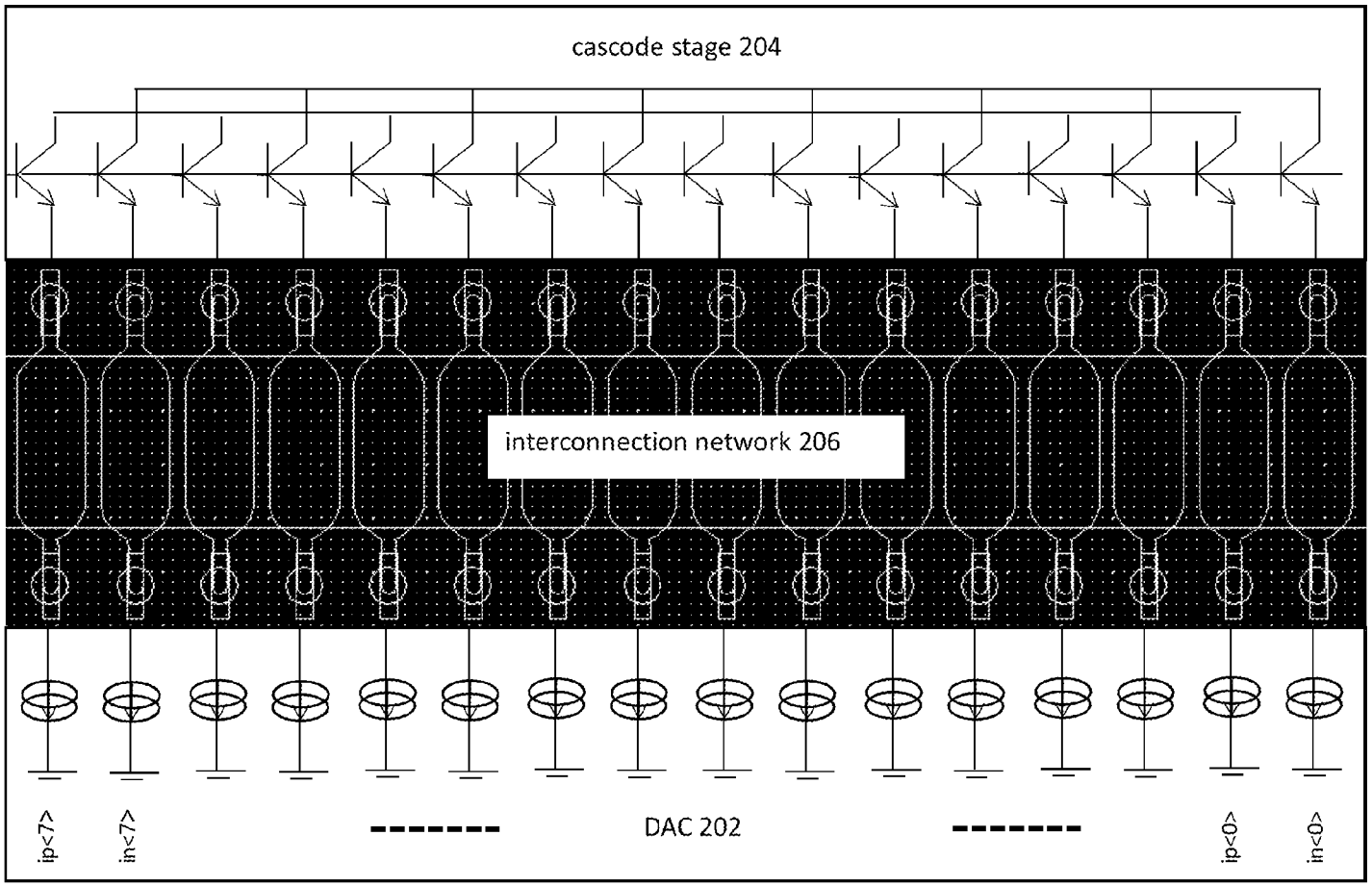
FIG. 2 is a simplified circuit diagram illustrating a digital-to-analog converter, according to some embodiments of the disclosure.

FIG. 2 is a simplified circuit diagram illustrating a digital-to-analog converter (system), according to some embodiments of the disclosure. To connect the DAC cores 202 directly to the cascode stage 204, an interconnect network 206 or a network of traces may be provided to connect the outputs of the DAC cores using separate traces for each DAC core to the cascode stage. For instance, the eight parallel DAC cores may have eight differential output pairs (or sixteen differential outputs), and the eight cascodes may have eight differential input pairs (or sixteen differential inputs). Through sixteen traces in the interconnection network 206 (a network of traces), the DAC cores are directly connected to the cascodes.

Overshoots of transient currents appearing at the output of a DAC core is one of the several issues to consider when designing the DAC system such as the one shown in FIG. 1. At each data transition moment (moment when input data transitions), large transient currents appear at the outputs of a DAC cores. The switching transient currents from the current source cells of a DAC core may be summed together at the DAC output. In particular, the switching transient currents can generate a huge overshoot when output traces have large parasitic inductance. The overshoot can cause the drain voltage of the switches in the DAC cores to exceed the compliance range of the CMOS transistors in the DAC cores. When the drain voltage is too low, it can limit the normal operation of the current source. When the drain voltage is too high, the drain voltage can exceed the maximum operating voltage allowed in CMOS and give rise to reliability issues in the DAC core. Thus, stringent design constraints are imposed upon output traces to ensure the inductance of the output trace is low to avoid the huge overshoot of transient currents.

By providing separate traces to connect the outputs of the DAC cores to the inputs of the cascode stage, the transient current per output pair can be reduced, thereby reducing laminate complexity regarding inductance mitigation. The width and length of the traces and the spacing between the traces determines the parasitic inductances of the interconnect network, and thus directly impact the system performance. By carrying a lower current for each trace (as opposed to carrying a large current at the output of a single DAC core), the constraints imposed on the traces are relaxed and provide greater design freedom. By using multiple DAC cores and separate traces for each of these DAC cores, the transient current on the output traces can be reduced effectively (and more easily) for the separate traces and thus making it possible to optimize the laminate interconnection network design for the cascode system.

Electromigration is another issue to be considered when providing a high current output system. Specifically, electromigration reliability in a high current system is a critical reliability concern and can impose a limiting factor to the design. By implementing a DAC core with a current output of up to 64 milliamps instead of a single DAC with a current output of up to 512 milliamps, the design requirements are relaxed. By connecting the DAC cores directly to the cascode stage, the difficulty of sourcing a high amount of current, e.g., 512 milliamps, on CMOS technology is avoided, and thereby alleviating the issue of thermal stress on CMOS devices. For instance, narrower metal width and less metal stack-up are sufficient to provide a viable design for the network of traces. The relaxed constraints greatly simplify the physical implementation of the chip and help to ensure the long term reliability of the system.

The design of connecting the DAC cores directly to the cascode stage avoids combining the output (power) from the DAC cores at the output of the DAC cores. The output power from the DAC cores is (instead) combined in the cascode stage because the power combining network is better provided at the cascode stage output. Effectively, the power combining network is removed from the DAC output but placed in the cascode stage, thereby alleviating design constraints that power combining networks may impose on the DACs. An output power combining network generally needs to have adequate current drive capability, minimum loss of the fundamental power, and wide bandwidth. Preferably, the output power combining network can combine the power output without limiting the dynamic performance of the DAC cores. For a conventional design of combining high currents at the output of the DAC cores, the output load needs to be small enough to maintain low voltage swing at the DAC output, but at the same time large enough to achieve the desired output power. The competing factors would lead to compromises in the design, thereby limiting the maximum output power of the system.

By removing the power combining network away from the DAC output, the DAC cores see less output currents, and the requirements at the output load imposed on the DAC are relaxed. For example, the voltage swing at the emitter of the GaAs bipolar junction transistor (BJT) can be maintained low, which is advantageous for the DAC design. High output voltage swings are available at the collector of the GaAs cascode stage, allowing further optimization to meet the high output power goal. This also allows for greater amplitude/phase/timing design flexibility of the DAC design. The provision of two different process technologies in the design decouples design requirements at each stage. Furthermore, removing the power combining network away from the output of the DAC cores allows the requirements of a power combining network to be better met using a different process technology, and thus reaping the benefits of both technologies.

Dual-DAC Structure

Figure 3:
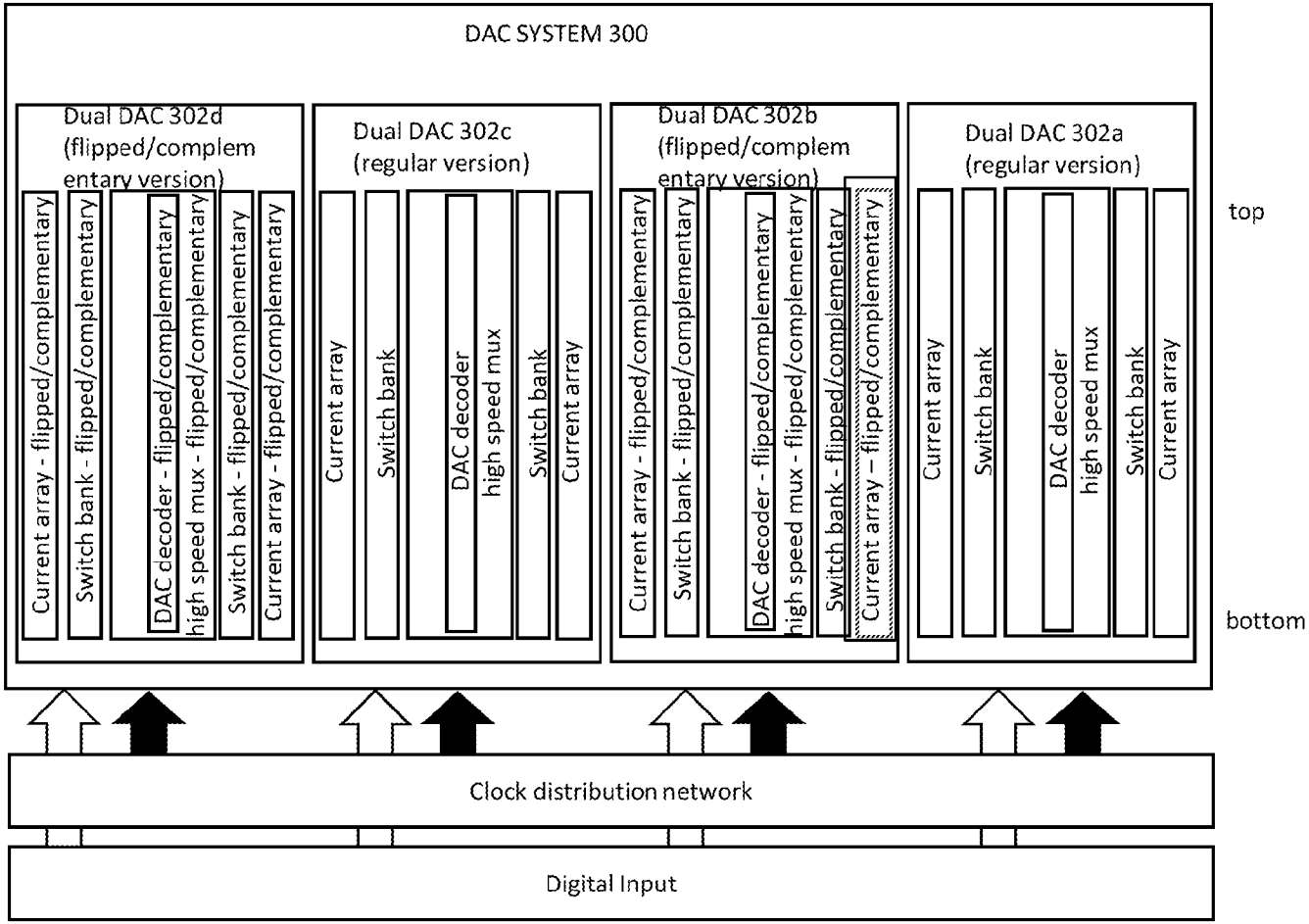
FIG. 3 illustrates an exemplary layout of a digital-to-analog converter, according to some embodiments of the disclosure.

FIG. 3 illustrates an exemplary layout of a digital-to-analog converter (or a digital-to-analog converter stage in a DAC system), according to some embodiments of the disclosure. Designing the hardware layout of a DAC stage comprising of many parallel DAC cores can be complex. One way to simplify the design of the DAC stage is to group/combine parallel DAC cores, and replicate grouped DAC cores for the desired number of parallel DAC cores in the DAC stage.

In some embodiments, eight parallel DAC cores are grouped as pairs of two parallel DAC cores into four dual-DAC structures (dual-DACs 302a, 302b, 303c 302d). Each of the DAC cores/structures comprises an array of current sources (shown as "current array" in FIG. 3), a bank of switches (shown as "switch bank" in FIG. 3) and switch drivers (shown as "switch bank" in FIG. 3). Furthermore, the parallel DAC cores may include DAC decoders (shown as "DAC decoder" in FIG. 3) and high speed multiplexers (shown as "high speed mux" in FIG. 3). If the parallel DAC cores are grouped together and if the same input word is provided to each of parallel DAC cores, the DAC decoder and/or the high speed multiplexer may be structurally shared between each pair of DAC cores to reduce the complexity of the design, alleviates thermal stress, and increases efficiency.

When there are many DAC cores in the DAC system, thermal stress may be a concern. Especially, the array of current sources, the bank of switches and the switch drivers for each parallel DAC core tend to be very hot during operation. Due to the different coefficient of thermal expansion between metal and the surround material, the thermal stress on the die can cause metal connections to break or malfunction, leading to performance degradation and in some cases, a fatal failure of the device. The heat generated in a high output power DAC system may dissipate from the chip along multiple paths, one of which is from the chip surface to the laminate through the bumps. The thermal performance of the chip thus significantly affects the thermal stability of the laminate as well. To improve thermal performance, the (massive and hot) transistors in current source arrays, switch banks and switch drivers (shown as eight parallel and segmented structures in FIG. 3) are arranged/positioned in the outer area in the hardware layout of each dual-DAC. The heat generated from the transistors are thus more uniformly distributed across the hardware layout/chip area of the DAC system 300 to enhance the thermal property of the chip, and thereby achieving adequate reliability. Furthermore, the design avoids localized heating or avoids hot spots of the device.

Flipped or Complementary Ordering of Cells

In some embodiments, to reduce the timing skew and effect of the gradient, every other dual-DAC may be flipped or made complementary in layout. For instance, a DAC system 300 may have eight parallel DAC cores arranged/grouped as four dual-DAC structures 302a, 302b, 303c 302d, and every other dual-DAC (dual-DAC 302b, 302d) are flipped or made complementary with adjacent dual-DACs in the layout. At a block level view in the hardware layout, each dual-DAC has N cells for receiving and/or processing N-bits of a digital input word (one cell for receiving/processing one bit, e.g., arranged from top to bottom or one side to another side of the DAC system 300), and the hardware in the DAC system routes the N bits in the digital input word across the N cells where the N-bits are arranged in a particular order in the layout (which may not be the natural order from the least significant bit to the most significant bit). The particular order associated with the layout can be flipped with respect to a next/adjacent dual-DAC or made complementary with a next/adjacent dual-DAC. This feature of providing a reduction in timing skew and effect of the gradient can also be provided at the level of parallel DAC cores (instead of at the level of dual-DACs), where fora parallel DAC core, the order of the N cells can be flipped or made complementary with a next/adjacent parallel DAC core.

Generally, the clock timing skew among switch units can cause mismatches in switching transients. The errors from the switching transient mismatches sum up to a nonlinear term and may lead to distortions. In some embodiments, the clock signal is distributed from the bottom of the system and every other dual-DAC (e.g., dual-DAC 302b, 302d) may be flipped upside down (the cells in the dual-DAC are arranged in a reverse order in the layout) or next/adjacent dual-DACs are made complementary with each other to compensate for the segment/timing skew. In this manner, the same bit in the digital input word is provided to a cell that is at the top of the array of cells in every other dual-DAC as well as at the bottom of another array of cells in the other dual-DACs. By flipping the order for a next/adjacent dual-DAC or arranging a next/adjacent dual-DAC with a complementary order, issues arising from timing skews may be averaged or mitigated, and the need to implement a clock tree structure is avoided, thereby making the hardware layout easier and at the same time alleviating current density issues. A detailed example is explained further in relation to FIG. 4.

Figure 4:
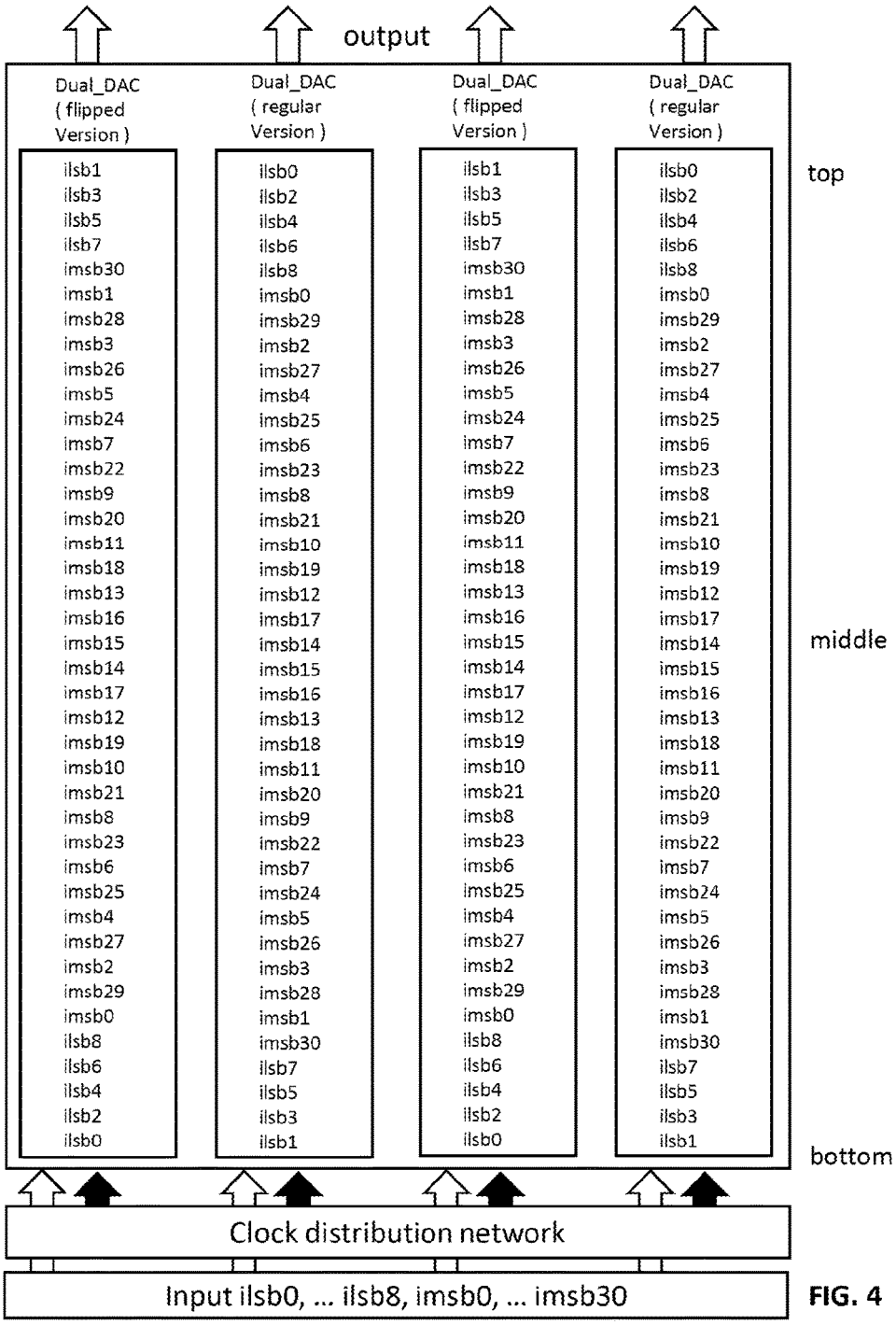
FIG. 4 illustrates four arrays of cells for receiving and processing an input word in four dual digital-to-analog converter cores, according to some embodiments of the disclosure.

In the hardware layout, the N cells may be arranged as an array of cells (arranged one next to each other in the hardware layout, e.g., from top to bottom, as seen in FIGS. 3 and 4) for receiving/processing to N bits arranged in a particular order. When the order for a next/adjacent dual-DAC is flipped in layout with respect to a dual-DAC, the order/arrangement of the N-bits that the array of N cells in the next/adjacent dual-DAC processes is reversed with respect to the order in the dual-DAC. In other words, the DAC decoder, the switch drivers, and the current source array in the array of N cells of the dual-DAC used to receive/process the N bits are arranged in a reverse order when compared to the order in the next/adjacent dual-DACs. When the order of dual-DAC is made complementary with a next/adjacent dual-DAC, the order/arrangement of the N-bits that the array of N cells in the next/adjacent dual-DAC processes is complementary or balanced with respect to the order of the dual-DAC (to reduce the timing skew and effect of the gradient). In other words, the DAC decoder, the switch drivers, and the current source array in the array of N cells of the dual-DAC used to receive/process the N bits are arranged in an order that complements the order used by the next/adjacent dual-DACs.

According to one aspect, the hardware layout of each dual-DAC has an array of N cells for receiving and processing N bits of a digital input word. For every other dual-DAC, the array of N cells receives and processes the N bits arranged in a first order of the N bits. For instance, the "regular version of the dual_DAC" (of FIGS. 3 and 4) has an array of N cells for receiving/processing N bits arranged in a first order. For the other dual-DACs, e.g., the "flipped/complementary version of the dual_DAC" (of FIGS. 3 and 4) or the dual-DACs next/adjacent to the "regular version of the dual_DAC", the array of N cells receives and processes the N bits arranged in a second order of the N bits. The first order and the second order are complementary in such a way to allow a more even distribution of the bits overall. In some embodiments, the second order is a reversed order of the first order.

According to another aspect, the hardware layout of each parallel DAC core has an array of N cells for receiving and processing N bits of a digital input word. For every other parallel DAC core, the array of N cells receives and processes the N bits arranged in a first order of the N bits. For instance, every other parallel DAC cores, e.g., a regular version of the parallel DAC core has an array of N cells for receiving/processing N bits arranged in a first order. For the other parallel DAC cores, e.g., the parallel DAC cores next/adjacent to the regular version of the parallel DAC core, the array of N cells receives and processes the N bits arranged in a second order of the N bits. The first order and the second order are complementary in such a way to allow a more even distribution of the bits overall. In some embodiments, the second order is a reversed order of the first order.

Systematic Ordering of Cells

FIG. 4 illustrates four arrays of cells for receiving and processing an input word arranged in four dual digital-to-analog converter (DAC) cores, according to some embodiments of the disclosure. In this example, each dual-DAC is a segmented DAC for processing X number of least significant bits and Y number of most significant bits. The systematic ordering of the N bits in the digital input word (as routed by hardware) may be provided to the array of N cells according to/arranged in a particular order to minimize both the timing inaccuracies and/or the effect of the gradient.

In some embodiments, the hardware layout of each dual-DAC has an array of X+Y cells for receiving and processing X least significant bits and Y most significant bits, e.g., arranged from top to bottom. One or more of the following aspects may be employed in the systematic ordering of the bits.

According to one aspect of the systematic ordering of the bits in the digital input word, consider an array of X+Y cells comprising a top part, a middle part, and a bottom part. The top and bottom parts of the array of cells are considered at the outer part or near the edge of the hardware layout of the DAC system. To alleviate edge effects, effects from adjacent channels, and other factors, the cells for receiving and processing the least significant bits are distributed in the top part and the bottom part. In other words, at least some or all of the X least significant bits (less performance critical bits, shown as "ilsb0", . . . "ilsb8") are distributed to the top part of the array of cells. The cells for receiving and processing the most significant bits of the digital input word (more performance critical bits, shown as "imsb0", . . . "imsb30") are distributed in the middle part. In other words, at least some or all of the Y most significant bits are distributed to the middle part of the array of cells.

To more evenly distribute the arrangement and order of the bits, an order of the N bits can be defined by bits in even positions arranged an ascending order according to the bit position (e.g., ilsb0, ilsb2, ilsb4, ilsb6, ilsb8, imsb0, imsb0, imsb2, imsb4, . . . imsb30) and bits in odd positions arranged in a descending order according to the bit position (e.g., imsb29, imsb27, imsb25, imsb23, imsb21, . . . imsb3, imsb1, ilsb7, ilsb5, ilsb3, ilsb1).

The arrangement of the bits in ascending order may occur in a contiguous portion of the array of cells, where the order of the N bits are defined by at least some of the bits in even positions arranged in an ascending order according to the bit position for a contiguous portion of the array of N cells and at least some of the bits in odd positions arranged in a descending order according to the bit position for the same contiguous portion of the array of N cells.

To provide an even more distributed order of the N bits, some of the bits in even positions may be interleaved in arrangement with some of the bits in odd positions. In other words, at least some of the bits in even positions in ascending order are arranged as every other bit, along with at least some of the bits in odd positions in descending order as the other bits (in a contiguous portion of the array of cells). For instance, the Y most significant bits may be arranged according to the order where bits in even position are arranged as every other (one) bit and the bits in odd position are arranged in the rest of the bits.

In some embodiments, the interleaving of bits in even position in an ascending order and bits in odd position in a descending order may occur in a contiguous portion of the array of cells (e.g., a part of the middle portion or the entire middle portion), where an order of the N bits are defined by at least some of the bits in even positions in ascending order and those bits are arranged as every other bit in the order for at least a contiguous portion of the array of N cells, along with at least some of the bits in odd positions in descending order as the other bits in the order for the contiguous portion of the array of N cells.

A table illustrating the above aspects is shown below showing the systematic ordering (order 1) of the input bits to the dual-DACs according to one particular exemplary order to alleviate timing skews and effect of the gradient in the layout of the dual-DACs. Note in the embodiment shown in FIG. 4, the dual-DACs alternates between exemplary order 1 and a reversed version of exemplary order 1.

EXEMPLARY ORDER 1

| Bit | Part | Even/Odd Position |
|---|---|---|
| ilsb0 | Top | Even |
| ilsb2 | Top | Even |
| ilsb4 | Top | Even |
| ilsb6 | Top | Even |
| ilsb8 | Top | Even |
| imsb0 | Middle | Even |
| imsb29 | Middle | Odd |
| imsb2 | Middle | Even |
| imsb27 | Middle | Odd |
| imsb4 | Middle | Even |
| imsb25 | Middle | Odd |
| imsb6 | Middle | Even |
| imsb23 | Middle | Odd |
| imsb8 | Middle | Even |
| imsb21 | Middle | Odd |
| imsb10 | Middle | Even |

-continued

| EXEMPLARY ORDER 1 | | |
|---|---|---|
| Bit | Part | Even/Odd Position |
| imsb19 | Middle | Odd |
| imsb12 | Middle | Even |
| imsb17 | Middle | Odd |
| imsb14 | Middle | Even |
| imsb15 | Middle | Odd |
| imsb16 | Middle | Even |
| imsb13 | Middle | Odd |
| imsb18 | Middle | Even |
| imsbl 1 | Middle | Odd |
| imsb20 | Middle | Even |
| imsb9 | Middle | Odd |
| imsb22 | Middle | Even |
| imsb7 | Middle | Odd |
| imsb24 | Middle | Even |
| imsb5 | Middle | Odd |
| imsb26 | Middle | Even |
| imsb3 | Middle | Odd |
| imsb28 | Middle | Even |
| imsb1 | Middle | Odd |
| imsb30 | Middle | Even |
| ilsb7 | Bottom | Odd |
| ilsb5 | Bottom | Odd |
| ilsb3 | Bottom | Odd |
| ilsbl | Bottom | Odd |

In summary, the least significant bits may be provided to cells that are at the outer side of the array (in the top part and the bottom part), and the more performance-critical most significant bits may be provided to cells residing/arranged in the middle of the array, e.g., with imsb15 bit being in the center of the array (in the middle part). In the regular version of the dual-DAC core, the bits in even bit positions can be arranged in an ascending order from the top to the bottom of the array, and the bits in odd bit positions can be arranged in an ascending order from the bottom to the top of the array. The sequence can be reversed in the flipped version of the dual-DAC core. The bits in even positions and the bits in odd positions are interleaved in the middle part of the array. This averaging technique effectively suppresses the errors caused by the timing skew and/or the gradient. Conventional methods may randomize input bits to reduce such effect, but the present disclosure proposes a systematic pattern which better reduces such effects.

Besides the systematic pattern shown in the table above, other orderings can also be used. The following table illustrates another further exemplary ordering of cells (exemplary order 2):

| EXEMPLARY ORDER 2 | | | |
|---|---|---|---|
| Bit | Part | Even/Odd Position | Contiguous Portion |
| ilsb0 | Top | Even | 1 |
| ilsb2 | Top | Even | 1 |
| ilsb4 | Top | Even | 1 |
| ilsb6 | Top | Even | 1 |
| ilsb8 | Top | Even | 1 |
| imsb15 | Middle | Odd | 2 |
| imsb16 | Middle | Even | 2 |
| imsb13 | Middle | Odd | 2 |
| imsb18 | Middle | Even | 2 |
| imsb11 | Middle | Odd | 2 |
| imsb20 | Middle | Even | 2 |
| imsb9 | Middle | Odd | 2 |
| imsb22 | Middle | Even | 2 |
| imsb7 | Middle | Odd | 2 |
| imsb24 | Middle | Even | 2 |
| imsb5 | Middle | Odd | 2 |

-continued

| EXEMPLARY ORDER 2 | | | |
|---|---|---|---|
| Bit | Part | Even/Odd Position | Contiguous Portion |
| imsb26 | Middle | Even | 2 |
| imsb3 | Middle | Odd | 2 |
| imsb28 | Middle | Even | 2 |
| imsb1 | Middle | Odd | 2 |
| imsb30 | Middle | Even | 2 |
| imsb0 | Middle | Even | 3 |
| imsb29 | Middle | Odd | 3 |
| imsb2 | Middle | Even | 3 |
| imsb27 | Middle | Odd | 3 |
| imsb4 | Middle | Even | 3 |
| imsb25 | Middle | Odd | 3 |
| imsb6 | Middle | Even | 3 |
| imsb23 | Middle | Odd | 3 |
| imsb8 | Middle | Even | 3 |
| imsb21 | Middle | Odd | 3 |
| imsb10 | Middle | Even | 3 |
| imsb19 | Middle | Odd | 3 |
| imsb12 | Middle | Even | 3 |
| imsb17 | Middle | Odd | 3 |
| imsb14 | Middle | Even | 3 |
| ilsb7 | Bottom | Odd | 4 |
| ilsb5 | Bottom | Odd | 4 |
| ilsb3 | Bottom | Odd | 4 |
| ilsb1 | Bottom | Odd | 4 |

In the above ordering (order 2), the middle portion has interleaved sequence of bits in even position (even bits) and odd position (odd bits). Some of the bits in even position are provided in ascending order in segments, e.g., separately in contiguous portion 2 (imsb16, imsb18, imsb20, imsb22, . . . imb28, imsb30) and contiguous portion 3 (imsb0, imsb2, imsb4, imsb6, . . . imsb12, imsb14). Some of the bits in odd position are provided in descending order in segments, e.g., separately in contiguous portion 2 (imsb15, imsb13, imsb11, imsb9, . . . imsb 3, imsb1) and contiguous portion 3 (imsb29, imsb27, imsb25, . . . imsb19, imsb17). Note that exemplary order 1 is a special case where the bits in even positions are provided in an ascending order for the entire array of cells, and the bits in odd position are provided in a descending order for the entire array of cells.

Variations on Complementary Ordering

There are several possible variations on pairing two orders which are complementary. For instance, exemplary order 1 and a reversed version of exemplary order 1 are complementary. In another instance, exemplary order 2 and a reversed version of exemplary order 2 are complementary. In yet another instance, a reversed version of exemplary order 1 and exemplary order 2 are complementary. In yet a further instance, exemplary order 1 and a reversed version of exemplary order 2 are complementary. Note exemplary order 1 and exemplary order 2 are illustrative orderings having the features described herein, it is envisioned that other illustrative orderings having the same features can also be used for providing complementary ordering.

Although specific examples are shown in the present disclosure, it is envisioned that other patterns following the spirit of the above examples can be used. Furthermore, besides providing complementary ordering for adjacent dual-DACs, the complementary ordering can also be provided for parallel-DAC cores which have not been grouped as pairs (i.e., not grouped as dual-DACs). The complementary ordering would alternate between two complementary orders from one single DAC to the next/adjacent single DAC.

High Output Power DAC System as an FIR Filter

Figure 5:
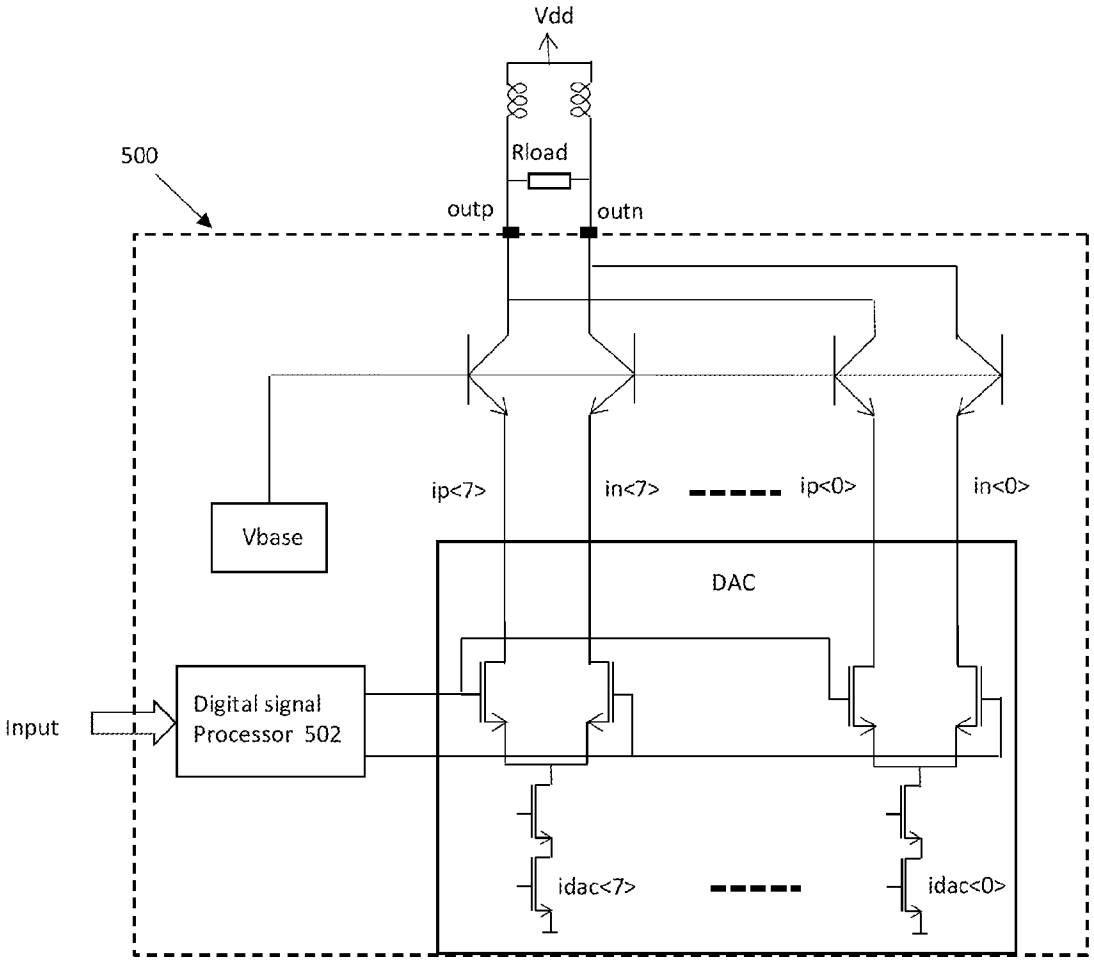
FIG. 5 shows an illustrative system diagram of a high output power DAC system, according to some embodiments of the disclosure.

FIG. 5 shows an illustrative system diagram of a high output power DAC system. Leveraging the benefits from the hardware design of such DAC system 500, a digital signal processor 502 may be provided to manipulate the digital input (e.g., low voltage differential signal (LVDS) input) to achieve one or more other objectives. For instance, system performance may be improved by arranging bits in a digital input word in a specific/random manner to improve the spurious performance. Alternatively, the arrangement of bits may be provided by hardware as shown in FIG. 4 or variations thereof.

In one instance, input codes can be arranged by the digital signal processor 502 (and the DAC cores may be programmed) to provide a filtering function. In one embodiment, the parallel DAC cores can provide a finite impulse response (FIR) filter. An FIR filter may implement a delay, a linear multiplier, multiplier coefficients, and a summation. Accordingly, an FIR filter structure can be created using the parallel DAC cores by manipulating the input codes to each parallel DAC core using the digital signal processor 502 and combining the output in the cascode stage to provide a summation for the FIR filter. Each DAC core has a sample-and-hold function and can use the different input code to provide a delay for the FIR filter. Furthermore, each DAC core has an array of current sources for performing (highly) linear multiplication for the FIR filter. The output current of the DAC cores are programmable to correspond to multiplier coefficients of the FIR filter. The large and programmable range of the DAC currents in the proposed design can set highly precision and programmable multiplier coefficients. The summation is performed at the system output by the output power combining network at no additional cost. The power dissipation of the multiplication and summation is negligible. Therefore, it provides a particularly suitable solution for analog FIR filter with lower power consumption.

High Output Power DAC System with Digital Predistortion

Figure 6:
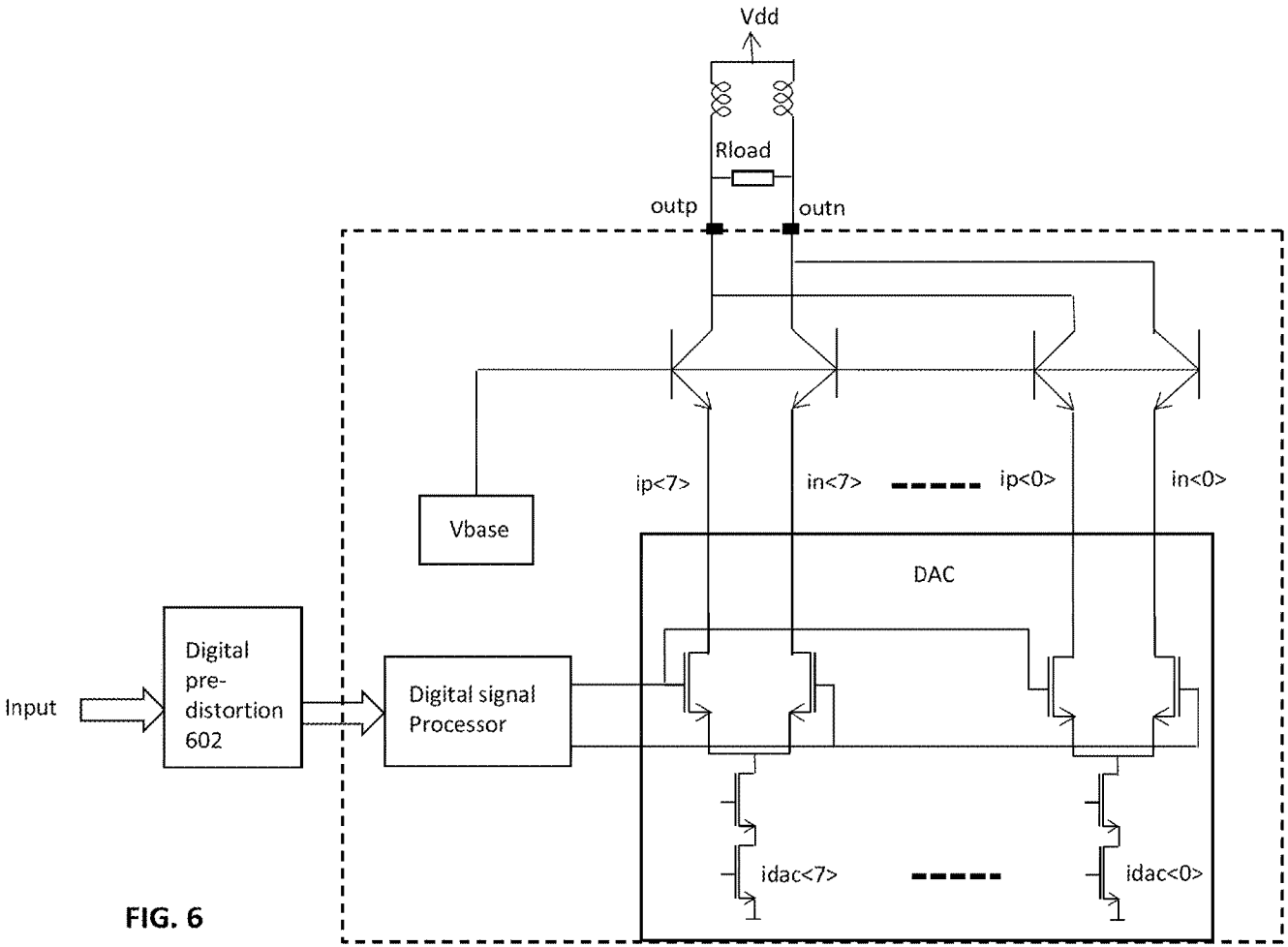
FIG. 6 shows an illustrative system diagram of another high output power DAC system, according to some embodiments of the disclosure.

FIG. 6 shows an illustrative system diagram of another high output power DAC system, according to some embodiments of the disclosure. One feature of the cascode stage in the DAC system as shown in FIGS. 1 and 2 may serve as a power amplifier in a radio frequency transmitter for amplifying and combining the outputs of the parallel DAC-cores in the DAC stage. As in many power amplifiers, non-linearities are often present, especially when the power amplifier is operating or is desired to operate in a high efficiency high output power mode. To alleviate issues/errors in the DAC stage and the cascode stage, a DAC system may be provided to include a digital pre-distortion processor 602 for pre-distorting the digital input signal by measuring non-linearities present at the DAC stage and the cascode stage (in some cases error(s) could also be measured). For instance, non-linearities may be measured by comparing the output of the DAC stage and/or the cascode stage against an expected output to determine the non-linear behavior of the DAC stage and/or the cascode stage. An inverse of the non-linear behavior may be determined and provided as an input to the DAC stage and/or the cascode stage. Alternatively, the non-linearity can also be compensated for by restoring the signal, for example, the current pulse in the DAC, to its ideal waveform.

The system performance can be further improved by applying digital pre-distortion (DPD). External narrowband DPD may be applied to the system in order to reduce the nonlinearities of the GaAs and other short-term deterministic effects. During the calibration process, the amplitude and phase coefficients of the correction vector can be extracted and the correction vector can be combined with the original input vector to achieve the narrowband correction.

Open loop DPD is a relatively straightforward technique that makes signal corrections based on a static model of the distortion and/or non-ideal errors of the system (without any adaptation algorithm), which may have been characterized at design time, or perhaps at factory calibration. Open loop DPD can be efficiently implemented using a lookup table having indexed by a sample of the signal to be pre-distorted, containing correction coefficients derived from the measured distortion of the DAC system.

The random effects of the mismatch errors are reduced maximally in the described DAC system through reducing both the static mismatch errors of the current source array and the timing mismatch errors of the switches/switch drivers. An open-loop DPD system that is not sensitive to the digital back off levels, the part-to-part variation, the board-to-board variation, the temperature, and the number of the carriers, can be implemented due to the unique characteristic of the DAC system. In this implementation, one single set of coefficients can be used to compensate for the non-linearities under multiple corner conditions mentioned above. This greatly reduces the matrix size of the pre-distortion coefficients and the digital computation power.

By not using a closed-loop DPD, the complexity of the system is significantly reduced. In other existing systems that require DPD, the mismatch in the system has significant effects so that either the closed-loop DPD (adaptive) or calibration at each condition is necessary which leads to a large matrix of the coefficients and sometimes becomes unpractical.

Any suitable digital pre-distortion processor may be used, for example, a narrow band digital pre-distortion processor which can optimize performance within a particular range frequencies of the DAC system. Or preferably, a broadband digital pre-distortion processor may be used, which may provide a better overall spectrum. It is noted that a digital pre-distortion system works better against systematic errors than random errors/effects. By reducing the DAC random errors and providing an integrated signal chain, less random effects are present, thereby allowing the digital pre-distortion system to work effectively in correcting the non-linearity present in both the cascode stage and the DAC.

Exemplary Application and Implementation

To further clarify the present embodiments, an illustrative implementation of the DAC system is explained below. Using the concepts explained herein, a high output power high speed DAC can be provided. In one illustrative implementation, a 14 bit 6.4 giga-samples per second (GSPS) RF DAC is provided using a hybrid process, using 65 nm CMOS technology for the parallel DAC cores and using GaAs technology for the cascode stage. The peak output power may be programmable up to 29 dBm with 50 ohm double terminated output load (power ratio in decibels (dB) of the measured power referenced to one milliwatt (mW)). This result is more than 200 times the output power of a conventional transmitter (TX) DAC. The achievable drain efficiency of the DAC running at 6.4 GSPS is 20%, which includes a data interface and the digital processing, where conventional DACs operate with drain efficiencies of less than 1%. The power dissipation of the overall system is only 2.3 W for 23 dBm peak output power at the full DAC update rate of 6.4 GSPS. If provided with an external digital pre-distortion (DPD) in a RF transmitter using this DAC and a power amplifier, the system can synthesize the downstream cable spectrum from direct current (DC) to 1.28 GHz and support, e.g., Data Over Cable Service Interface Specification (DOCSIS) 3.0 application.

Moreover, in a cable modem termination system, both the coarse gain setting and the fine gain adjustment are necessary. These coarse gain setting and fine gain adjustments are in general implemented by the variable gain amplifier (VGA) before the power amplifier. With the integration of the parallel DAC and the cascode system, the coarse and the fine gain DACs can be used to replace the function of the VGA and adjust the output power through the programmable current. The reference current is controlled and as the result the total output current is programmed accordingly.

In 14-bit 6.4 GSPS RF DAC, the DAC may utilize a quad-switch architecture to effectively enable dual-edge clocking operation and a constant switching scheme, thereby reducing the requirements of the power-supply system and on-chip noise isolation. Furthermore, the DAC system may use double data rate (i.e., clocking the data on the rising and falling edge of the clock) to achieve up to 6.4 GHz GSPS data rate. The DAC system may support a dual-port 1.6 GSPS low voltage differential signaling (LVDS) data interface. The digital interface thus comprises of two 14 bit LVDS ports running at a maximum speed of 1.6 GSPS, and provides an effective input data rate of 3.2 GSPS. Using the double data rate clocking, the DAC system can achieve a sampling rate of 6.4 GSPS. The on-chip digital engine may bridge the gap between the 3.2 GSPS of the input data rate and the 6.4 GSPS data-rate by 2× interpolating the input data. In addition, a mix-mode may be implemented to enhance the output power in the $2^{nd}$ and $3^{rd}$ Nyquist zone. The interpolation may support 80% of the input bandwidth and thereby providing an effective synthesizable bandwidth of 1.28 GHz.

Merging Parallel DACs with Cascode Stage

The provision of a two stage process in this DAC using hybrid technologies allows the decoupling of requirements, and thereby relaxing the design requirements of the DAC system while leveraging the benefits of both technologies. As a result, with greater flexibility, the design of the DAC system is able to achieve higher output power and higher drain efficiency.

In some embodiments, the GaAs heterojunction bipolar transistors used in the cascode stage may have a collector-emitter breakdown voltage of 16V. In some applications, the GaAs heterojunction bipolar transistors may operate with a supply voltage of 6 V (as seen in FIG. 4). This configuration offers a high output power capability of 200 times more than conventional transmitter DACs. Generally speaking, the limits regarding the output power are the breakdown voltages of the cascode transistor and the thermal characteristics of the package. In some embodiments, the eight parallel differential pair GaAs cascodes are connected to the n-channel MOSFET (NMOS) DAC cores. A feedback path which is a replica of the main differential pair may be utilized in a closed-loop to establish Vbase voltage (as seen in FIG. 4) to the GaAs cascode.

Merging CMOS and GaAs in one MCM is made possible by advances in 3D Packaging technology. The merged chip comprises a Flip Chip BGA assembly with 2 hybrid dies in one package. Both CMOS and GaAs dies are flip-chips. Cupillar bumping is incorporated for 65 nm CMOS and GaAs dies. 12 mm*12 mm 196 ball flip chip BGA (ball grid array) package is chosen with the heat spreader on the top to improve the thermal resistance. The two hybrid dies are integrated on the laminate side-by-side with minimum allowed die-to-die spacing to reduce the electrical parasitics.

Variations on Implementation

While the embodiments disclosed herein relates to a DAC having eight parallel DAC cores, other numbers of parallel DAC cores, such as 2, 4, 6, 8, 10, 12, 14, 16, any suitable multiples of two, preferably multiples of four, etc., are envisioned and considered part of the disclosure. It is noted that the choice of number of parallel DAC cores depend on multiple trade-offs. While the use of more parallel DAC cores in a DAC system in theory would generate a higher power output than a DAC system with less parallel cores, the use of more parallel DAC cores significantly increases the design/layout complexity of the hardware chips. Accordingly, the use of eight parallel DAC cores was chosen in view of the competing factors.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to radio frequency wireless communications, radar, audio and video equipment, base stations, transmitters, and other digital-processing-based systems which may benefit from a high power output DAC. Specifically, the features discussed herein can be applied to the communications infrastructure segment and the wireless infrastructure segment, such as the cable modem termination system (CMTS), e.g., DOCSIS, distributed antenna system networks, e.g., active antenna system, micro-cell base stations, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Note that all optional features of the apparatus described above may also be implemented with respect to the method or process described herein and specifics in the examples may be used anywhere in one or more embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

Note that all optional features of the apparatus described above may also be implemented with respect to the method or process described herein and specifics in the examples may be used anywhere in one or more embodiments.

In one example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

Examine 1 is a digital to analog converter (DAC), the DAC comprising M parallel DAC cores, wherein: M is an integer greater or equal to 4; each DAC core converts a digital input signal to an analog output signal; and the same input digital word is provided as the digital input signal to the plurality of parallel DAC cores; and a cascode stage directly connected to the outputs of the M parallel DAC cores for combining the outputs of the M parallel DAC cores to provide an aggregate analog output.

In Example 2, the subject matter of Example 1 can optionally include M being greater or equal to 8.

In Example 3, the subject matter of Example 1 or 2 can optionally include the M parallel DAC cores being built using any one or more of the following: complementary metal-oxide-semiconductor (CMOS) technology, bipolar-complementary metal-oxide-semiconductor (BiCMOS), and silicon-on-insulator (SOI); and/or the cascode stage comprising Gallium Arsenide (GaAs) cascodes and/or Gallium Nitride (GaN) cascodes.

In Example 4, the subject matter of any one of Examples 1-3 can optionally include the cascode stage comprising M cascodes each connected to a corresponding parallel DAC cores directly through a network of traces.

In Example 5, the subject matter of any one of Examples 1-4 can optionally include: the M number of parallel DAC cores comprising M differential output pairs or 2M differential outputs; the M cascodes comprising M differential input pairs or 2M differential inputs; and the M differential output pairs or 2M differential outputs of parallel DAC cores being connected directly to the M differential input pairs or 2M differential outputs of the cascodes respectively through the network of traces.

In Example 6, the subject matter of Example 2 can optionally include the 8 parallel DAC cores being grouped into pairs of 2 parallel DACs as 4 dual-DACs in the hardware layout of the DAC. (Alternatively, the subject matter of any one of Examples 1-5 can optionally include the M parallel DAC cores being grouped into pairs of 2 parallel DACs as M/2 dual-DACs in the hardware layout of the DAC.)

In Example 7, the subject matter of Example 6 can optionally include: each of 8 parallel DAC comprising (1) an array of current sources, and (2) a bank of switches and switch drivers; and (1) the array of current sources and (2) the bank of switches and the switch drivers are arranged in the outer area of the 4 dual-DACs in the hardware layout of the DAC.

In Example 8, the subject matter of Example 6 or 7 can optionally include: each dual-DAC comprising a DAC decoder and a high speed multiplexer; and the DAC decoder and the high speed multiplexer being shared between the two parallel DAC of each dual-DAC.

In Example 9, the subject matter of any one of Examples 6-8 can optionally include the hardware layout of every adjacent dual-DAC is flipped to compensate for timing skew and/or the gradient.

In Example 10, the subject matter of any one of Examples 6-9 can optionally include: the hardware layout of each dual-DAC having an array of N cells for receiving and processing N bits of a digital word arranged in a particular order of the N bits; and the particular order of the N bits that the array of N cells processes alternating for the dual-DACs between a regular order and a reversed order.

In Example 11, the subject matter of any one of Examples 6-10 can optionally include: the hardware layout of each dual-DAC having an array of X+Y cells for receiving and processing X least significant bits and Y most significant bits; the array of X+Y cells comprising a top part, a middle part, and a bottom part arranged in the hardware layout; the cells for receiving and processing the least significant bits being distributed in the top part and the bottom part; and the cells for receiving and processing the most significant bits of the digital input word being distributed in the middle part.

In Example 12, the subject matter of any one of Examples 6-11 can optionally include: the hardware layout of each dual-DAC having an array of N cells for receiving and processing N bits of a digital input word; for every other dual-DAC, the array of N cells receiving and processing the N bits arranged in a first order of the N bits; for the other dual-DACs, the array of N cells receiving and processing the N bits arranged in a second order of the N bits; and wherein the second order complements the first order.

In Example 13, the subject matter of Examples 12 can optionally include the first order of the N bits being defined by at least some of the bits in even positions arranged in an ascending order according to the bit position for a contiguous portion of the array of N cells and at least some of the bits in odd positions arranged in a descending order according to the bit position for the contiguous portion of the array of N cells.

In Example 14, the subject matter of Example 12 or 13 can optionally include: the first order of the N bits being defined by at least some of the bits in even positions in ascending order are arranged as every other bit in the first order for at least a contiguous portion of the array of N cells, along with at least some of the bits in odd positions in descending order as the other bits in the first order for the contiguous portion of the array of N cells.

In Example 15, the subject matter of any one of Examples 1-14 can optionally include the DAC generating an analog output signal having a current between 256 milliamps to 512 milliamps.

In Example 16, the subject matter of any one of Examples 1-15 can optionally include the DAC generating an analog output signal having a current between 512 milliamps to 3 amps.

Example 17 is a digital-to-analog converter (DAC) system for converting a digital input signal to an analog output signal, the DAC system comprising: a DAC stage comprising M parallel DAC cores, wherein M is equal to or greater than 4; a cascode stage comprising M parallel cascodes connected to the output of the eight parallel DAC cores, the cascode stage configured to amplify and combine the outputs of the M parallel DAC cores, wherein the outputs of the DAC cores in the DAC stage and inputs of the cascodes in cascode stage are directly connected through a network of traces; and a digital pre-distortion processor for (1) providing an inverse of the non-linearity as input to the DAC stage and/or the cascode stage to compensate non-ideal errors of the DAC stage and/or the cascode stage by and/or (2) restore the ideal waveforms to compensate the non-ideal errors present in the DAC stage and/or the cascode stage.

In Example 18, the subject matter of Example 17 can optionally include any one of Examples 2-16.

In Example 19, the subject matter of Example 17 or 18 can optionally include the digital pre-distortion processor being an open-loop digital pre-distortion processor.

Example 20 is an apparatus for providing a finite impulse response filter (FIR), the apparatus comprising: M parallel DAC cores, wherein M is an integer greater or equal to 4 and each DAC core converts a digital input signal to an analog output signal; a cascode stage directly connected to the outputs of the M parallel DAC cores for combining the outputs of the M parallel DAC cores to provide an aggregate analog output; a digital signal processor configured to distribute different input codes to the M parallel DAC cores to provide a finite impulse response (FIR) filter using the M parallel DACs; a cascode stage comprising a network of M cascodes connected to the M parallel DAC cores, the cascode stage configured to perform a summation for the FIR filter; wherein: each of the M parallel DACs uses different input codes to implement delay for the FIR filter; each of the M parallel DACs comprises an array of current sources for performing linear multiplication for the FIR filter; and the output current of each of the M parallel DACs are programmable to correspond to multiplier coefficients for the FIR filter.

What is claimed is:

[1. A digital to analog converter (DAC), the DAC comprising:

M parallel DAC cores, wherein:

M is an integer greater or equal to 4;

each DAC core converts a digital input signal to an analog output signal; and the same input digital word is provided as the digital input signal to the plurality of parallel DAC cores; and a cascode stage directly connected to the outputs of the M parallel DAC cores for combining the outputs of the M parallel DAC cores to provide an aggregate analog output.]

[2. The DAC of claim 1, wherein M is greater or equal to 8.]

[3. The DAC of claim 1, wherein:

the M parallel DAC cores are built using any one or more of the following: complementary metal-oxide-semiconductor (CMOS) technology, bipolar-complementary metal-oxide-semiconductor (BiCMOS), and silicon-on-insulator (SOI); and the cascode stage comprises Gallium Arsenide (GaAs) cascodes and/or Gallium Nitride (GaN) cascodes.]

[4. The DAC of claim 1, wherein:

the cascode stage comprises a M cascodes each connected to a corresponding parallel DAC cores directly through a network of traces.]

[5. The DAC of claim 1, wherein:

the M number of parallel DAC cores comprises M differential output pairs or 2M differential outputs;

the M cascodes comprises M differential input pairs or 2M differential inputs; and the M differential output pairs or 2M differential outputs of parallel DAC cores are connected directly to the M differential input pairs or 2M differential outputs of the cascodes respectively through the network of traces.]

6. [The DAC of claim 2, wherein:] *A digital-to-analog converter (DAC), comprising:*

*8 or more parallel DAC cores, wherein:*

*each DAC core converts a digital input signal to an analog output signal;* the 8 *or more* parallel DAC cores are grouped into pairs of [2] parallel DACs as *at least* 4 dual-DACs in the hardware layout of the DAC*; and*

*the same input digital word is provided as the digital input signal to the plurality of parallel DAC cores; and*

*a cascode stage directly connected to the outputs of the 8 or more parallel DAC cores for combining the outputs of the 8 or more parallel DAC cores to provide an aggregate analog output.*

7. The DAC of claim 6, wherein:

each of *the* 8 *or more* parallel DAC comprises (1) an array of current sources, and (2) a bank of switches and switch drivers; and (1) the array of current sources and (2) the bank of switches and the switch drivers are arranged in the outer area of the 4 dual-DACs in the hardware layout of the DAC.

8. The DAC of claim 6, wherein:

each dual-DAC comprises a DAC decoder and a high speed multiplexer; and the DAC decoder and the high speed multiplexer are shared between the two parallel DAC of each dual-DAC.

9. The DAC of claim 6, wherein:

the hardware layout of every adjacent dual-DAC is flipped to compensate for timing skew and/or the gradient.

10. The DAC of claim 6, further comprising:

the hardware layout of each dual-DAC has an array of N cells for receiving and processing N bits of a digital word arranged in a particular order of the N bits; and the particular order of the N bits that the array of N cells processes alternates for the dual-DACs between a regular order and a reversed order.

11. The DAC of claim 6, wherein:

the hardware layout of each dual-DAC has an array of X+Y cells for receiving and processing X least significant bits and Y most significant bits;

the array of X+Y cells comprises a top part, a middle part, and a bottom part arranged in the hardware layout;

the cells for receiving and processing the least significant bits are distributed in the top part and the bottom part; and the cells for receiving and processing the most significant bits of the digital input word are distributed in the middle part.

12. The DAC of claim 6, wherein:

the hardware layout of each dual-DAC has an array of N cells for receiving and processing N bits of a digital input word;

for every other dual-DAC, the array of N cells receives and processes the N bits arranged in a first order of the N bits;

for the other dual-DACs, the array of N cells receives and processes the N bits arranged in a second order of the N bits; and wherein the second order complements the first order.

13. The DAC of claim 12, wherein:

the first order of the N hits are defined by at least some of the bits in even positions arranged in an ascending order according to the bit position for a contiguous portion of the array of N cells and at least some of the bits in odd positions arranged in a descending order according to the bit position for the contiguous portion of the array of N cells.

14. The DAC of claim 12, wherein:

the first order of the N bits are defined by at least some of the bits in even positions in ascending order are arranged as every other bit in the first order for at least a contiguous portion of the array of N cells, along with at least some of the bits in odd positions in descending order as the other bits in the first order for the contiguous portion of the array of N cells.

[15. The DAC of claim 1, wherein:

the DAC generates an analog output signal having a current between 256 milliamps to 512 milliamps.]

[16. The DAC of claim 1, wherein:

the DAC generates an analog output signal having a current between 512 milliamps to 3 amps.]

[17. A digital-to-analog converter (DAC) system for converting a digital input signal to an analog output signal, the DAC system comprising:

a DAC stage comprising M parallel DAC cores, wherein M is equal to or greater than 4;

a cascode stage comprising M parallel cascodes connected to the output of the M parallel DAC cores, the cascode stage configured to amplify and combine the outputs of the M parallel DAC cores, wherein the outputs of the DAC cores in the DAC stage and inputs of the cascodes in cascode stage are directly connected through a network of traces; and a digital pre-distortion processor for (1) providing an inverse of the non-linearity as input to the DAC stage and/or the cascode stage to compensate non-ideal errors of the DAC stage and/or the cascode stage and/or (2) restore the ideal waveforms to compensate the non-ideal errors present in the DAC stage and/or the cascode stage.]

[18. The DAC system of claim 17, wherein the M is greater than or equal to 8.]

[19. The DAC system of claim 17, wherein the digital pre-distortion processor is an open-loop digital pre-distortion processor.]

[20. An apparatus for providing a finite impulse response filter (FIR), the apparatus comprising:

M parallel DAC cores, wherein M is an integer greater or equal to 4 and each DAC core converts a digital input signal to an analog output signal;

a cascode stage directly connected to the outputs of the M parallel DAC cores for combining the outputs of the M parallel DAC cores to provide an aggregate analog output;

a digital signal processor configured to distribute different input codes to the M parallel DAC cores to provide a finite impulse response (FIR) filter using the M parallel DACs;

a cascode stage comprising a network of M cascodes connected to the M parallel DAC cores, the cascode stage configured to perform a summation for the FIR filter;

wherein:

each of the M parallel DACs uses different input codes to implement delay for the FIR filter;

each of the M parallel DACs comprises an array of current sources for performing linear multiplication for the FIR filter; and the output current of each of the M parallel DACs are programmable to correspond to multiplier coefficients for the FIR filter.]

*21. The DAC of claim 6, wherein:*

*the 8 or more parallel DAC cores are built using any one or more of the following: complementary metal-oxide-semiconductor (CMOS) technology, bipolar-complementary metal-oxide-semiconductor (BiCMOS), and silicon-on-insulator (SOI).*

*22. The DAC of claim 6, wherein:*

*the cascode stage comprises Gallium Arsenide (GaAs) cascodes and/or Gallium Nitride (GaN) cascodes.*

*23. The DAC of claim 6, further comprising:*

*an open-loop digital pre-distortion processor for (1) providing an inverse of the non-linearity as input to the DAC stage and/or the cascode stage to compensate non-ideal errors of the DAC stage and/or the cascode stage and/or (2) restore the ideal waveforms to compensate the non-ideal errors present in the DAC stage and/or the cascode stage.*

*24. The DAC of claim 6, wherein:*

*the cascode stage comprises 8 or more cascodes connected to corresponding parallel DAC cores directly through separate traces for each parallel DAC core.*

*25. The DAC of claim 24, wherein:*

*the cascode stage comprises a power combining network for joining outputs of the 8 or more parallel cascodes to generate the aggregate analog output.*

*26. A digital to analog converter (DAC), the DAC comprising:*

*parallel DAC cores, wherein:*

*each DAC core converts a digital input signal to an analog output signal;*

*the same input digital word is provided as the digital input signal to the plurality of parallel DAC cores;*

*each DAC core comprises a plurality of bit cells for converting most significant bits and least significant bits of the same input digital word to the analog output signal;*

*the most significant bits and least significant bits are routed to bit cells of a first parallel DAC core in a first order in hardware layout; and*

*the most significant bits and least significant bits are routed to bit cells of a second parallel DAC core adjacent to the first parallel DAC core in a reversed or complementary order with respect to the first order;*

*parallel cascodes directly connected to corresponding outputs of parallel DAC cores; and*

*a power combining network for joining outputs of the parallel cascodes to generate an aggregate analog output.*

*27. The DAC of claim 26, wherein:*

*the parallel DAC cores are built using any one or more of the following: complementary metal-oxide-semiconductor (CMOS) technology, bipolar-complementary metal-oxide-semiconductor (BiCMOS), and silicon-on-insulator (SOI).*

*28. The DAC of claim 26, wherein:*

*the parallel cascodes comprise Gallium Arsenide (GaAs) cascodes and/or Gallium Nitride (GaN) cascodes.*

*29. The DAC of claim 26, wherein:*

*the parallel DAC cores comprise 8 or more parallel DAC cores.*

*30. The DAC of claim 29, wherein:*

*the parallel cascodes comprise 8 or more cascodes connected to corresponding parallel DAC cores directly through separate traces for each parallel DAC core.*

*31. A digital to analog converter (DAC), the DAC comprising:*

*parallel DAC cores, wherein:*

*each DAC core converts a digital input signal to an analog output signal;*

*the same input digital word is provided as the digital input signal to the plurality of parallel DAC cores;*

*each DAC core comprises a plurality of bit cells for converting most significant bits and least significant bits of the same input digital word to the analog output signal; and*

*the least significant bits are routed to bit cells near an edge of the hardware layout of the DAC, and/or the most significant bits are routed to bit cells in a middle part of the hardware layout of the DAC;*

*parallel cascodes directly connected to corresponding outputs of parallel DAC cores; and*

*a power combining network for joining outputs of the parallel cascodes to generate an aggregate analog output.*

*32. The DAC of claim 31, wherein:*

*the parallel DAC cores are built using any one or more of the following: complementary metal-oxide-semiconductor (CMOS) technology, bipolar-complementary metal-oxide-semiconductor (BiCMOS), and silicon-on-insulator (SOI).*

*33. The DAC of claim 31, wherein:*

*the parallel cascodes comprise Gallium Arsenide (GaAs) cascodes and/or Gallium Nitride (GaN) cascodes.*

*34. The DAC of claim 31, wherein:*

*the parallel DAC cores comprise 8 or more parallel DAC cores.*

*35. The DAC of claim 34, wherein:*

*the parallel cascodes comprise 8 or more cascodes connected to corresponding parallel DAC cores directly through separate traces for each parallel DAC core.*

* * * * *